United States Patent
Nakano (10) Patent No.: US 9,835,941 B2
(45) Date of Patent: Dec. 5, 2017

(54) IMPRINT APPARATUS, IMPRINT METHOD, AND METHOD OF MANUFACTURING ARTICLE

(71) Applicant: CANON KABUSHIKI KAISHA, Tokyo (JP)

(72) Inventor: Hitoshi Nakano, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/524,611

(22) Filed: Oct. 27, 2014

(65) Prior Publication Data

US 2015/0123312 A1 May 7, 2015

(51) Int. Cl.
| | |
|---|---|
| *B29C 59/00* | (2006.01) |
| *G03F 7/00* | (2006.01) |
| *B29L 31/34* | (2006.01) |
| *B29C 59/02* | (2006.01) |
| *B29C 59/16* | (2006.01) |
| *G03F 7/20* | (2006.01) |

(52) U.S. Cl.
CPC ............ *G03F 7/0002* (2013.01); *B29C 59/02* (2013.01); *B29C 59/026* (2013.01); *B29C 59/16* (2013.01); *B29L 2031/3406* (2013.01); *B29L 2031/3475* (2013.01); *G03F 7/70483* (2013.01)

(58) Field of Classification Search
CPC ....... B29C 59/02; B29C 59/026; B29C 59/16; G03F 7/0002; G03F 7/70483
USPC ........ 425/174.4, 385; 264/293, 85, 494, 496
See application file for complete search history.

(56) References Cited

U.S. PATENT DOCUMENTS

| | | |
|---|---|---|
| 7,090,716 B2 | 8/2006 | McMackin et al. |
| 8,962,233 B2 | 2/2015 | Kawabata et al. |
| 2012/0199997 A1* | 8/2012 | Tanabe ................... B82Y 10/00 264/82 |

(Continued)

FOREIGN PATENT DOCUMENTS

| | | |
|---|---|---|
| JP | 3700001 B2 | 9/2005 |
| JP | 2011158647 A | 8/2011 |
| JP | 2012-164785 A | 8/2012 |

(Continued)

OTHER PUBLICATIONS

Japanese Office Action issued in Japanese counterpart application No. JP2013-228753, dated Sep. 4, 2015.

(Continued)

*Primary Examiner* — Alison L Hindenlang
*Assistant Examiner* — Lawrence D Hohenbrink, Jr.
(74) *Attorney, Agent, or Firm* — Rossi, Kimms & McDowell LLP (57) ABSTRACT

The present invention provides an imprint apparatus for performing an imprint process of molding an imprint material on a substrate with a mold to form a pattern on the substrate, the apparatus including a supply device configured to supply, to a space between the imprint material on the substrate and the mold, a penetrating gas that penetrates at least one of the mold, the imprint material and the substrate and a condensable gas that is liquefied by pressure rise due to the molding, and a controller configured to control the supply device so as to change at least one of a supply amount of the penetrating gas and a supply amount of the condensable gas based on information on a recipe for the imprint process.

38 Claims, 2 Drawing Sheets

(56) References Cited

U.S. PATENT DOCUMENTS

2014/0145370 A1     5/2014  Tanabe et al.
2014/0327183 A1*   11/2014  Mori .................... G03F 7/0002
                                                         264/293

FOREIGN PATENT DOCUMENTS

| JP | 2013070033 A | | 4/2013 |
| JP | 2013145879 A | | 7/2013 |
| JP | 2013168645 A | * | 8/2013 |
| WO | 2013035761 A1 | | 3/2013 |

OTHER PUBLICATIONS

Office Action issued in Japanese Appln. No. 2015-254766, mailed Sep. 16, 2016.
Office Action issued in Japanese Patent Application No. 2015254766 dated Apr. 7, 2017.

* cited by examiner

IMPRINT APPARATUS, IMPRINT METHOD, AND METHOD OF MANUFACTURING ARTICLE

BACKGROUND OF THE INVENTION

Field of the Invention

The present invention relates to an imprint apparatus, and a method of manufacturing an article.

Description of the Related Art

As micropatterning of semiconductor devices is requested more and more, a microfabrication technique of molding an uncured resin on a substrate using a mold and forming the pattern of the resin on the substrate has received attention. The technique is referred to as an imprint technique, and can form a fine structure on the order of nanometer on the substrate. For example, in an imprint apparatus adopting a photo-curing method as a curing method of a resin, an ultraviolet-curing resin (imprint material) is applied to a shot region (imprint region) on the substrate, and the resin (uncured resin) is molded using a mold. Then, the mold is separated (released) after curing the resin by irradiation with ultraviolet rays, thereby forming the pattern of the resin on the substrate.

In general, an atmosphere within an imprint apparatus is air. Therefore, if the mold and the resin are pressed against each other, the air stays between them, and then turns into a residual gas which may form bubbles in the resin. In this case, a trouble may occur in a pattern to be transferred onto the substrate. This makes it impossible to form an accurate pattern on the substrate. To cope with this, it is considered to wait until the residual gas is dissolved, diffused, or penetrates into the resin and the mold to disappear. However, this takes much time to perform an imprint process.

To solve this, U.S. Pat. No. 7,090,716 proposes an imprint apparatus which uses a penetrating gas as an imprint atmosphere, and dissolves or diffuses the penetrating gas remained in a resin and a mold, thereby quickly reducing the residual gas. Also, Japanese Patent No. 3700001 proposes an imprint apparatus which uses, as an imprint atmosphere, a condensable gas which condenses along with a pressure rise (increase) when a mold and a resin are pressed against each other. The condensable gas is liquefied when remaining, and its volume is reduced to a few hundredth as compared to that in the gaseous form. This makes it possible to suppress an influence on the pattern formation of the residual gas. When using the condensable gas, since the viscosity of the resin is reduced by absorbing the liquefied condensable gas into the resin, the spreading speed of the resin on the substrate is increased, thus achieving the pattern formation in a shorter time.

On the other hand, if the penetrating gas and the condensable gas enter the optical path of, for example, an interferometer which measures a substrate stage position, the interferometer cannot measure the substrate stage position accurately. To cope with this, Japanese Patent Laid-Open No. 2012-164785 proposes a technique of using, as an imprint atmosphere, a gas mixture which is obtained by mixing a penetrating gas and a condensable gas, and adjusting a mixture ratio between the penetrating gas and the condensable gas to reduce a measurement error by the interferometer (to obtain the same refractive index as that of air).

In pattern formation by an imprint process in a condensable gas atmosphere, however, the liquefied condensable gas absorbed into a resin is discharged outside after releasing, thus possibly deteriorating the shape of the pattern which has been formed on a substrate. There are tendencies of, for example, an increase in the surface roughness of the pattern, a reduction in the density of the resin, the narrowness of the line width of the pattern, and a deterioration in the sectional shape of the pattern. These tendencies are stronger as the concentration of the condensable gas increases. On the other hand, a time for the pattern formation can be reduced as the concentration of the condensable gas increases. Thus, a trade-off relation exists between accurate pattern formation and an increase in a throughput (productivity).

SUMMARY OF THE INVENTION

The present invention provides, for example, an imprint apparatus advantageous in terms of compatibility between accurate patterning and throughput.

According to one aspect of the present invention, there is provided an imprint apparatus for performing an imprint process of molding an imprint material on a substrate with a mold to form a pattern on the substrate, the apparatus including a supply device configured to supply, to a space between the imprint material on the substrate and the mold, a penetrating gas that penetrates at least one of the mold, the imprint material and the substrate and a condensable gas that is liquefied by pressure rise due to the molding, and a controller configured to control the supply device so as to change at least one of a supply amount of the penetrating gas and a supply amount of the condensable gas based on information on a recipe for the imprint process.

Further aspects of the present invention will become apparent from the following description of exemplary embodiments with reference to the attached drawings.

DESCRIPTION OF THE EMBODIMENTS

Preferred embodiments of the present invention will be described below with reference to the accompanying drawings. Note that the same reference numerals denote the same members throughout the drawings, and a repetitive description thereof will not be given.

Figure 1:
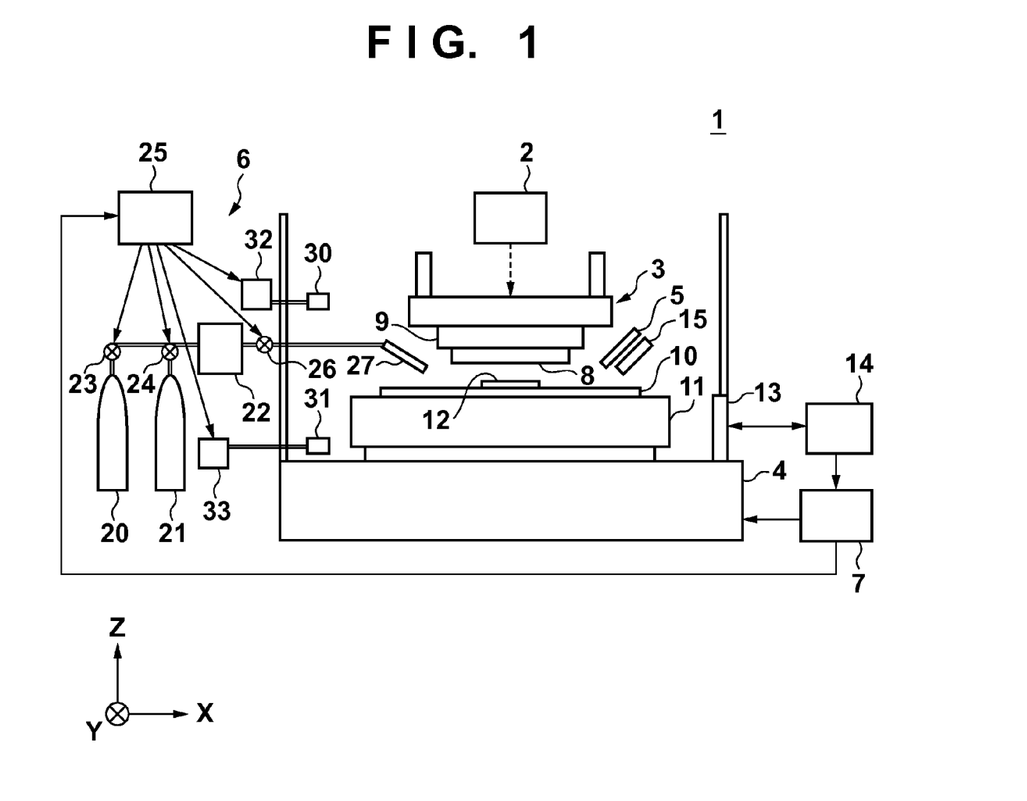
FIG. 1 is a schematic view showing the arrangement of an imprint apparatus as one aspect of the present invention.

FIG. 1 is a schematic view showing the arrangement of an imprint apparatus 1 as one aspect of the present invention. The imprint apparatus 1 is an apparatus which is used for manufacturing a device such as a semiconductor device, and performs an imprint process of molding and curing an imprint material (resin) on a substrate using a mold and forming a pattern (the pattern of the resin) on the substrate. The imprint apparatus 1 adopts a photo-curing method as a curing method of the resin. The imprint apparatus 1 includes an illumination system 2, a mold holding unit 3, a substrate stage 4, a resin supply unit 5, a gas supply unit 6, a control unit 7, and a measurement unit 15. As shown in FIG. 1, a Z-axis is defined as a direction parallel to the optical axis of the illumination system 2 which irradiates the resin on the substrate with ultraviolet rays, and an X-axis and a Y-axis are defined as directions orthogonal to each other in a plane perpendicular to the Z-axis.

The illumination system 2 irradiates a mold 8 with ultraviolet rays at the time of an imprint process. The illumination system 2 includes an optical element for adjusting ultraviolet rays emitted from a light source to light suitable for imprinting. The mold 8 is a mold which includes a predetermined pattern (for example, a three-dimensional pattern corresponding to a pattern that should be formed on a substrate 10) formed three-dimensionally on a surface facing the substrate 10. The mold 8 is made of a material (for example, quartz) capable of passing ultraviolet rays. In addition, an alignment mark detection system (not shown) is arranged adjacent to the illumination system 2 or in a form included in the illumination system 2, and performs alignment between an alignment mark formed on the substrate 10 in a preceding step and the alignment mark of the mold 8.

The mold holding unit 3 holds the mold 8 by a vacuum suction force or an electrostatic force. The mold holding unit 3 includes a mold chuck 9, and a mold moving mechanism (not shown) which moves the mold 8 in the Z-axis direction. The mold moving mechanism implements a press operation of pressing the mold 8 against an uncured resin on the substrate 10, and a release operation of separating the mold 8 from a cured resin on the substrate 10. Thus, in this embodiment, the press operation and the release operation in the imprint apparatus 1 are implemented by moving the mold 8 in the Z-axis direction. However, the press operation and the release operation may be implemented by moving the substrate 10 (substrate stage 4) in the Z-axis direction, or by moving both of the mold 8 and the substrate 10 in the Z-axis direction.

The substrate stage 4, for example, holds the substrate 10 by vacuum suction, and includes a substrate chuck 11 which can move in an X-Y plane. The substrate 10 is a substrate made of, for example, single-crystal silicon. A resin which is molded using the mold 8 is applied (supplied) on the surface of the substrate 10. A plurality of reference mirrors (reflecting surfaces) 13 for controlling the positions of six degrees of freedom (X, Y, Z, ωx, ωy, and ωz) are also arranged on the substrate stage 4. The imprint apparatus 1 includes a plurality of laser interferometers 14 which measure the position of the substrate stage 4 by irradiating the respective reference mirrors 13 with light. The laser interferometer 14 measures the position of the substrate stage 4 in real time. The control unit 7 performs alignment control of the substrate 10 (substrate stage 4) based on values measured by the laser interferometers 14.

The resin supply unit 5 supplies an uncured resin 12 onto the substrate 10. The resin 12 is an ultraviolet-curing resin having a property of being cured upon reception of ultraviolet rays, and selected appropriately according to semiconductor device manufacturing steps or the like.

In the press operation of pressing the mold 8 against the uncured resin on the substrate 10, the gas supply unit 6 supplies a gas mixture which is obtained by mixing a penetrating gas and a condensable gas to the pressing position, that is, a space between the resin on the substrate 10 and the mold 8. The gas supply unit 6 includes a penetrating gas supply unit 20 which supplies a penetrating gas having a dissolving or diffusing property for at least one of the mold 8, the resin 12, and the substrate 10, in this embodiment, the penetrating gas which can penetrate into the mold 8 while molding the resin 12 using the mold 8. The gas supply unit 6 also includes a condensable gas supply unit 21 which supplies a condensable gas having a property of being condensed and liquefied by pressure application (a pressure rise or increase) when molding the resin 12.

The penetrating gas supply unit 20 supplies, as the penetrating gas, a gas such as helium and hydrogen. Note that when using combustible hydrogen as the penetrating gas, an arrangement which is careful for fire by separately installing an explosion-proof system inside the imprint apparatus 1 is required.

The condensable gas supply unit 21 supplies, as the condensable gas, HFC (hydrofluorocarbon) represented by, for example, HFC-245fa (1,1,1,3,3-pentafluoropropane, $CHF_2CH_2CF_3$). Also, the condensable gas supply unit 21 may supply, as the condensable gas, HFE (hydrofluoroether) represented by HFE-245mc ($CF_3CF_2OCH_3$).

The gas supply unit 6 includes a gas mixing unit 22 which mixes the penetrating gas and the condensable gas, respectively, supplied from the penetrating gas supply unit 20 and the condensable gas supply unit 21. The gas supply unit 6 also includes a gas supply control unit 25 which controls the respective supply amounts of the penetrating gas and the condensable gas to be supplied to the gas mixing unit 22 by a first valve 23 and a second valve 24, respectively. The gas supply control unit 25 performs control of mixing the respective gases at a predetermined component ratio by the gas mixing unit 22, and supplying the gas mixture to a space between the resin on the substrate 10 and the mold 8 via a gas supply nozzle 27 while adjusting a supply amount by a third valve 26. The gas supply control unit 25 may be formed to be installed separately in the apparatus and connected to the control unit 7 via a line, or may be formed integrally with the control unit 7.

The control unit 7 includes a CPU and a memory, and controls the whole (operation) of the imprint apparatus 1. The control unit 7 controls the imprint process, including the press operation and the release operation, of forming the pattern on the substrate 10. The control unit 7 also controls the gas supply unit 6 so as to change the mixture ratio between the penetrating gas and the condensable gas of the gas mixture. For example, the control unit 7 determines the mixture ratio between the penetrating gas and the condensable gas of the gas mixture supplied by the gas supply unit 6 when performing the imprint process. The control unit 7 may be formed integrally with another unit of the imprint apparatus 1, or may be formed separately (in a separate place) from the other unit of the imprint apparatus 1.

The measurement unit 15 measures a pattern formed by molding the resin 12 using the mold 8 and curing it, and obtains information on the features (the dimension and the shape) of the pattern. The information on the pattern features includes at least one of the line width, the contraction ratio, the sectional shape, the height, and the surface roughness of the pattern. The measurement unit 15 may be included in the illumination system 2, or may be formed by an off-axis alignment detection system. The measurement unit 15 may obtain the information on the pattern features by detecting an image of the pattern that has been formed on the substrate 10 or the intensity of the scattering light of light which has entered the pattern. The measurement unit 15 may be installed outside the imprint apparatus 1 as a scanning electron microscope (SEM) or an atomic force microscope (AFM).

The imprint process in the imprint apparatus 1 will be described. The control unit 7 comprehensively controls the respective units of the imprint apparatus 1, thereby performing the imprint process. First, the control unit 7 controls the substrate stage 4 to hold the substrate 10 transported by a substrate transport system, and move to the supply position of the resin supply unit 5. The resin supply unit 5 supplies the resin 12 to a predetermined shot region (imprint region)

of the substrate 10. Then, the control unit 7 controls the substrate stage 4 to move such that the shot region on the substrate 10 to which the resin 12 is supplied is positioned directly under the mold 8. The control unit 7 then performs, for example, alignment between the mold 8 and the substrate (the shot region thereon) and the magnification correction of the mold 8 by the mold moving mechanism, and presses the mold 8 against the resin 12 on the substrate 10 by moving the mold 8 using the mold moving mechanism. By pressing the mold 8 against the resin 12 on the substrate 10, the pattern (recessed portion) of the mold 8 is filled with the resin 12. In this state, ultraviolet ray irradiation is made by the illumination system 2 from the back surface (upper surface) of the mold 8, thereby curing the resin 12 by the ultraviolet rays which have passed through the mold 8. After curing the resin 12, the mold 8 is moved by the mold moving mechanism, and separated from the cured resin 12 on the substrate 10. Accordingly, the three-dimensional shape pattern of the resin 12 corresponding to the pattern of the mold 8 is formed in the shot region on the substrate 10.

When performing the imprint process according to this embodiment, the gas supply unit 6 supplies the gas mixture obtained by mixing the penetrating gas and the condensable gas to the space between the resin 12 on the substrate 10 and the mold 8. At this time, the control unit 7 determines an optimum mixture ratio between the penetrating gas and the condensable gas of the gas mixture based on, for example, the information on the pattern features (to be referred to as a "pattern shape evaluation value" hereinafter) obtained by the measurement unit 15. Accordingly, the gas mixture with the mixture ratio determined by the control unit 7 is supplied, by the gas supply unit 6, to the space between the resin 12 on the substrate 10 and the mold 8. For example, for the pattern shape evaluation value, the measurement unit 15 needs to obtain a pattern that has been formed in a previous shot region in advance before a pattern is formed in a next shot region. The optimum mixture ratio of the gas mixture can be determined, based on a table and an expression representing a relation between the pattern shape evaluation value and the mixture ratio (for example, the concentration of the condensable gas), such that the accuracy of the pattern formed on the substrate 10 falls within a tolerance. Note that information such as the table and the expression representing the relation between the pattern shape evaluation value and the mixture ratio is stored in the memory or the like of the control unit 7 in advance. Also, the optimum mixture ratio may be determined by storing the mixture ratio and pattern shape evaluation values in a plurality of shot regions where patterns are formed prior to the formation of the pattern in the shot region, and then calculating an estimated value which is predicted based on the average value or a statistical method. Note that the calculation of an estimated value with a higher accuracy is possible using the pattern shape evaluation values of the patterns formed in not only the shot region on one and the same substrate but also the shot regions on a plurality of substrates having undergone the imprint process. Also, the pattern shape evaluation value may be obtained by preparing a test substrate instead of the substrate 10, supplying the resin 12 onto the test substrate, molding the resin 12 on the test substrate using the mold 8 and curing it to form a pattern, and measuring the pattern by the measurement unit 15.

Figure 2A:
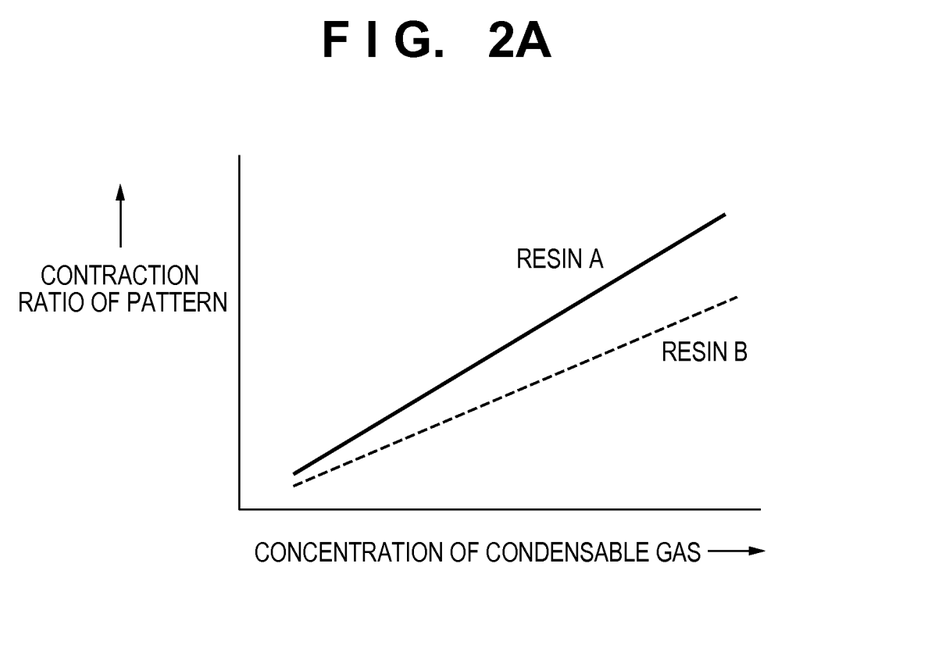
FIGS. 2A and 2B are graphs showing a relation between the contraction ratio of a pattern and the concentration of condensable gas in a gas mixture of a penetrating gas and the condensable gas.
Figure 2B:
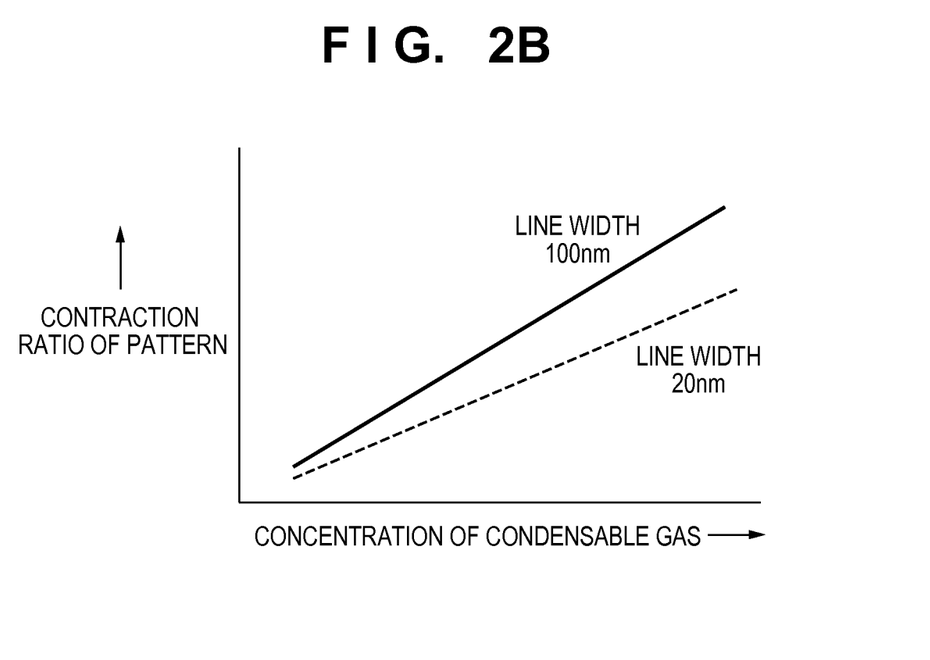

FIGS. 2A and 2B are graphs showing a result of obtaining a relation between the contraction ratio of the pattern and the concentration of condensable gas in gas mixture of a penetrating gas (helium gas) and the condensable gas. FIG. 2A shows a relation between the concentration of the condensable gas and the contraction ratio of the pattern of two types of resins A and B, respectively. FIG. 2B shows a relation between the concentration of the condensable gas and the contraction ratio of the pattern of different line widths (100 nm and 200 nm) in the same resin. As seen in FIGS. 2A and 2B, while the contraction ratio of the pattern increases in proportion to a rise in the concentration of the condensable gas in the gas mixture, variations in the type of resin and the line width of the pattern make the relations between the concentration of the condensable gas and the contraction ratio of the pattern different. Therefore, the information such as the table and the expression representing the relation between the concentration of the condensable gas and the contraction ratio of the pattern is preferably stored according to the types of resins 12 or the line widths of the patterns that should be formed on the substrate 10. The control unit 7 determines, using tables and expressions shown in FIGS. 2A and 2B, the mixture ratio of the gas mixture such that, for example, the contraction ratio of the pattern formed on the substrate 10 (the contraction ratio to the pattern of the mold 8) falls within a tolerance. This allows the accuracy of the pattern formed on the substrate 10 to fall within the tolerance. Furthermore, the control unit 7 preferably determines the mixture ratio of the gas mixture such that the concentration of the condensable gas in the gas mixture reaches a maximum. This makes it possible to maximize the amount of a liquefied condensable gas to be absorbed into the resin 12 (that is, a reduction in the viscosity of the resin 12). As a result, the spreading speed of the resin 12 on the substrate 10 is increased, thus achieving the pattern formation in a shorter time.

As described above, the imprint apparatus 1 according to this embodiment can achieve both accurate pattern formation and an increase in a throughput by determining the mixture ratio of the gas mixture based on the pattern shape evaluation value of the pattern formed on the substrate 10 or the test substrate.

Also, the mixture ratio of the penetrating gas and the condensable gas of the gas mixture supplied by the gas supply unit 6 may be determined based on, instead of an actually formed pattern, at least one of the type of resin to be supplied onto the substrate and the feature of a pattern that should be formed on the substrate. The recipe for the imprint process or the like includes information on the type of resin to be supplied onto the substrate and information on the feature of the pattern that should be formed on the substrate. Therefore, the table (FIG. 2A) representing the relation between the concentration of the condensable gas in the gas mixture and the contraction ratio of the pattern according to the type of resin or the table (FIG. 2B) representing the relation according to the type of pattern feature is stored. Then, the mixture ratio is determined using a table relation corresponding to the type of resin 12 to be supplied onto the substrate or a table relation corresponding to the type of feature of the pattern that should be formed on the substrate. Also, a table representing the relation between the concentration of the condensable gas in the gas mixture and the contraction ratio of the pattern according to a combination of the type of resin and the type of pattern feature may be stored. Then, the mixture ratio is determined using a table relation corresponding to the combination of the type of resin 12 to be supplied onto the substrate and the type of feature of the pattern that should be formed on the substrate. At this time, as described above, both of the accurate pattern formation and the increase in the throughput can be achieved by determining the mixture ratio such that the concentration of the condensable gas reaches maximum within the tolerance of the contraction ratio of the pattern formed on the substrate. When the mixture ratio of the gas mixture is determined based on the information on the type of resin to be supplied onto the substrate and the information on the type of feature of the pattern that should be formed on the substrate, the imprint apparatus 1 need not include the measurement unit 15. For example, a pattern shape evaluation value obtained by measuring a pattern with an external measurement apparatus such as the SEM or the AFM can be used.

As described above, the imprint apparatus 1 according to this embodiment can determine, irrespective of the type of resin 12 and the type of pattern feature, the optimum mixture ratio of the gas mixture which does not deteriorate the shape of the pattern formed on the substrate 10. Hence, the imprint apparatus 1 can achieve both the accurate pattern formation and the increase in the throughput, and provide an article such as a semiconductor device at high throughput, low cost, and high quality. A method of manufacturing a device (the semiconductor device, a magnetic storage media, a liquid crystal display element, or the like) serving as the article will be described. The manufacturing method includes a step of forming the pattern on the substrate (a wafer, a glass plate, a film-like substrate, or the like) using the imprint apparatus 1. The manufacturing method further includes a step of processing the substrate on which the pattern is formed. The processing step can include a step of removing the residual film of the pattern. The processing step can also include another known step such as a step of etching the substrate using the pattern as a mask. The method of manufacturing the article according to this embodiment is advantageous in at least one of the performance, the quality, the productivity, and the production cost of the article, as compared to conventional methods.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-228753 filed Nov. 1, 2013, which is hereby incorporated by reference herein in its entirety.

What is claimed is:

1. An imprint apparatus for performing an imprint process of molding an imprint material on a substrate with a mold to form a pattern on the substrate, the apparatus comprising:
   a supply device configured to supply, to a space between the imprint material on the substrate and the mold, a penetrating gas that penetrates at least one of the mold, the imprint material and the substrate and a condensable gas that is liquefied by pressure rise due to the molding; and
   a controller configured to control the supply device so as to change at least one of a supply amount of the penetrating gas and a supply amount of the condensable gas based on information representing, with respect to each type of a feature of a pattern to be formed on the substrate, a relation between concentration of the condensable gas and contraction ratio of a pattern to be formed on the substrate to a pattern of the mold, and information corresponding to the type of the feature.

2. An imprint apparatus for performing an imprint process of molding an imprint material on a substrate with a mold to form a pattern on the substrate, the apparatus comprising:
   a supply device configured to supply, to a space between the imprint material on the substrate and the mold, a penetrating gas that penetrates at least one of the mold, the imprint material and the substrate and a condensable gas that is liquefied by pressure rise due to the molding; and
   a controller configured to control the supply device so as to change at least one of a supply amount of the penetrating gas and a supply amount of the condensable gas based on information representing, with respect to each type of the imprint material, a relation between concentration of the condensable gas and contraction ratio of a pattern to be formed on the substrate to a pattern of the mold, and information corresponding to the type of the imprint material.

3. An imprint apparatus for performing an imprint process of molding an imprint material on a substrate with a mold to form a pattern on the substrate, the apparatus comprising:
   a supply device configured to supply, to a space between the imprint material on the substrate and the mold, a penetrating gas that penetrates at least one of the mold, the imprint material and the substrate and a condensable gas that is liquefied by pressure rise due to the molding; and
   a controller configured to control the supply device so as to change at least one of a supply amount of the penetrating gas and a supply amount of the condensable gas based on information representing, with respect to a combination of a type of the imprint material and a type of a feature of a pattern to be formed on the substrate, a relation between concentration of the condensable gas and contraction ratio of a pattern to be formed on the substrate to a pattern of the mold, and information corresponding to the combination.

4. An imprint apparatus for performing an imprint process of molding an imprint material on a substrate with a mold to form a pattern on the substrate, the apparatus comprising:
   a supply device configured to supply, to a space between the imprint material on the substrate and the mold, a penetrating gas that penetrates at least one of the mold, the imprint material and the substrate and a condensable gas that is liquefied by pressure rise due to the molding; and
   a controller configured to control the supply device so as to change a supply amount of the penetrating gas and a supply amount of the condensable gas based on information representing contraction ratio of a pattern formed on the substrate via the imprint process to a pattern of the mold.

5. A method of manufacturing an article, the method comprising:
   forming a pattern on a substrate using an imprint apparatus; and
   processing the substrate, on which the pattern has been formed, to manufacture the article,
   wherein the imprint apparatus performs an imprint process of molding an imprint material on the substrate with a mold to form a pattern on the substrate, and includes:
   a supply device configured to supply, to a space between the imprint material on the substrate and the mold, a penetrating gas that penetrates at least one of the mold, the imprint material and the substrate and a condensable gas that is liquefied by pressure rise due to the molding; and
   a controller configured to control the supply device so as to change at least one of a supply amount of the penetrating gas and a supply amount of the condensable gas based on information representing, with respect to each type of a feature of a pattern to be formed on the substrate, a relation between concentration of the condensable gas and contraction ratio of a pattern to be formed on the substrate to a pattern of the mold, and information corresponding to the type of the feature.

6. A method of manufacturing an article, the method comprising:
   forming a pattern on a substrate using an imprint apparatus; and
   processing the substrate, on which the pattern has been formed, to manufacture the article,
   wherein the imprint apparatus performs an imprint process of molding an imprint material on the substrate with a mold to form a pattern on the substrate, and includes:
   a supply device configured to supply, to a space between the imprint material on the substrate and the mold, a penetrating gas that penetrates at least one of the mold, the imprint material and the substrate and a condensable gas that is liquefied by pressure rise due to the molding; and
   a controller configured to control the supply device so as to change a supply amount of the penetrating gas and a supply amount of the condensable gas based on information representing contraction ratio of a pattern formed on the substrate via the imprint process to a pattern of the mold.

7. A method of manufacturing an article, the method comprising:
   forming a pattern on a substrate using an imprint apparatus; and
   processing the substrate, on which the pattern has been formed, to manufacture the article,
   wherein the imprint apparatus performs an imprint process of molding an imprint material on the substrate with a mold to form a pattern on the substrate, and includes:
   a supply device configured to supply, to a space between the imprint material on the substrate and the mold, a penetrating gas that penetrates at least one of the mold, the imprint material and the substrate and a condensable gas that is liquefied by pressure rise due to the molding; and
   a controller configured to control the supply device so as to change at least one of a supply amount of the penetrating gas and a supply amount of the condensable gas based on information representing, with respect to each type of the imprint material, a relation between concentration of the condensable gas and contraction ratio of a pattern to be formed on the substrate to a pattern of the mold, and information corresponding to the type of the imprint material.

8. A method of manufacturing an article, the method comprising:
   forming a pattern on a substrate using an imprint apparatus; and
   processing the substrate, on which the pattern has been formed, to manufacture the article,
   wherein the imprint apparatus performs an imprint process of molding an imprint material on the substrate with a mold to form a pattern on the substrate, and includes:
   a supply device configured to supply, to a space between the imprint material on the substrate and the mold, a penetrating gas that penetrates at least one of the mold, the imprint material and the substrate and a condensable gas that is liquefied by pressure rise due to the molding; and
   a controller configured to control the supply device so as to change at least one of a supply amount of the penetrating gas and a supply amount of the condensable gas based on information representing, with respect to a combination of a type of the imprint material and a type of a feature of a pattern to be formed on the substrate, a relation between concentration of the condensable gas and contraction ratio of a pattern to be formed on the substrate to a pattern of the mold, and information corresponding to the combination.

9. An imprint apparatus for forming a pattern on a substrate by pressing a mold against an imprint material on the substrate, the apparatus comprising:
   a supply device configured to supply, to a space between the mold and the substrate, a gas mixture including a condensable gas that is liquefied by the pressing; and
   a controller configured to control concentration of the condensable gas in the gas mixture supplied to the space by the supply device based on a feature, including at least one of a line width, a contraction ratio, a sectional shape, a height, or a surface roughness, of the pattern formed on the substrate, with respect to each type of a feature, including at least one of a dimension and a shape, of the pattern to be formed.

10. The apparatus according to claim 9, wherein the condensable gas includes at least one of pentafluoropropane, hydrofluorocarbon and hydrofluoroether.

11. The apparatus according to claim 9, wherein the supply device is configured to supply, to the space, the condensable gas, and a penetrating gas that penetrates the mold.

12. An imprint apparatus for forming a pattern on a substrate by pressing a mold against an imprint material on the substrate, the apparatus comprising:
   a supply device configured to supply, to a space between the mold and the substrate, a gas mixture including a condensable gas that is liquefied by the pressing; and
   a controller configured to control concentration of the condensable gas in the gas mixture supplied to the space by the supply device based on a feature, including at least one of a line width, a contraction ratio, a sectional shape, a height, or a surface roughness, of the pattern formed on the substrate, with respect to each combination between a type of the imprint material and a type of a feature, including at least one of a dimension and a shape, of the pattern to be formed.

13. The apparatus according to claim 12, wherein the supply device is configured to supply, to the space, the condensable gas, and a penetrating gas that penetrates the mold.

14. An imprint apparatus for forming a pattern on a substrate by pressing a mold against an imprint material on the substrate, the apparatus comprising:
   a supply device configured to supply, to a space between the mold and the substrate, a gas mixture including a condensable gas that is liquefied by the pressing,
   wherein a feature, including at least one of a line width, a contraction ratio, a sectional shape, a height, or a surface roughness, of the pattern formed on the substrate is caused to fall within a tolerance by concentration of the condensable gas in the gas mixture supplied to the space by the supply device with respect to each type of a feature, including at least one of a dimension and a shape, of the pattern to be formed.

15. The apparatus according to claim 14, wherein the supply device is configured to supply, to the space, the condensable gas, and a penetrating gas that penetrates the mold.

16. An imprint apparatus for forming a pattern on a substrate by pressing a mod against an imprint material on the substrate, the apparatus comprising:
   a supply device configured to supply, to a space between the mold and the substrate, a gas mixture including a condensable gas that is liquefied by the pressing,
   wherein a feature, including at least one of a line width, a contraction ratio, a sectional shape, a height, or a surface roughness, of the pattern formed on the substrate is caused to fall within a tolerance by concentration of the condensable gas in the gas mixture supplied to the space by the supply device with respect to each combination between a type of the imprint material and a type of a feature, including at least one of a dimension and a shape, of the pattern to be formed.

17. The apparatus according to claim 16, wherein the supply device is configured to supply, to the space, the condensable gas, and a penetrating gas that penetrates the mold.

18. A method of manufacturing an article, the method comprising:
   forming a pattern on a substrate using an imprint apparatus; and
   processing the substrate, on which the pattern has been formed, to manufacture the article,
   wherein the imprint apparatus forms a pattern on the substrate by pressing a mold against an imprint material on the substrate, and includes:
   a supply device configured to supply, to a space between the mold and the substrate, a gas mixture including a condensable gas that is liquefied by the pressing; and
   a controller configured to control concentration of the condensable gas in the gas mixture supplied to the space by the supply device based on a feature, including at least one of a line width, a contraction ratio, a sectional shape, a height, or a surface roughness, of the pattern formed on the substrate, with respect to each type of a feature, including at least one of a dimension and a shape, of the pattern to be formed.

19. An imprint method of forming a pattern on a substrate by pressing a mold against an imprint material on the substrate, the method comprising:
   pressing the mold against the imprint material with a gas mixture including a condensable gas that is liquefied by the pressing supplied, to a space between the mold and the substrate,
   wherein concentration of the condensable gas in the gas mixture supplied to the space is controlled based on a feature, including at least one of a line width, a contraction ratio, a sectional shape, a height, or a surface roughness, of the pattern formed on the substrate, with respect to each type of a feature, including at least one of a dimension and a shape, of the pattern to be formed.

20. The method according to claim 19, wherein the supplying supplies, to the space, the condensable gas, and a penetrating gas that penetrates the mold.

21. An imprint method of forming a pattern on a substrate by pressing a mold against an imprint material on the substrate, the method comprising:
   pressing the mold against the imprint material with a gas mixture including a condensable gas that is liquefied by the pressing supplied, to a space between the mold and the substrate,
   wherein concentration of the condensable gas in the gas mixture supplied to the space is controlled based on a feature, including at least one of a line width, a contraction ratio, a sectional shape, a height, or a surface roughness, of the pattern formed on the substrate, with respect to each combination between a type of the imprint material and a type of a feature, including at least one of a dimension and a shape, of the pattern to be formed.

22. The method according to claim 21, wherein the supplying supplies, to the space, the condensable gas, and a penetrating gas that penetrates the mold.

23. An imprint method of forming a pattern on a substrate by pressing a mold against an imprint material on the substrate, the method comprising:
   pressing the mold against the imprint material with a gas mixture including a condensable gas that is liquefied by the pressing supplied, to a space between the mold and the substrate,
   wherein a feature, including at least one of a line width, a contraction ratio, a sectional shape, a height, or a surface roughness, of the pattern formed on the substrate relative to a pattern of the mold is caused to fall within a tolerance by concentration of the condensable gas in the gas mixture supplied to the space with respect to each type of a feature, including at least one of a dimension and a shape, of the pattern to be formed.

24. The method according to claim 23, wherein the supplying supplies, to the space, the condensable gas, and a penetrating gas that penetrates the mold.

25. An imprint method of forming a pattern on a substrate by pressing a mold against an imprint material on the substrate, the method comprising:
   pressing the mold against the imprint material with a gas mixture including a condensable gas that is liquefied by the pressing supplied, to a space between the mold and the substrate,
   wherein a feature, including at least one of a line width, a contraction ratio, a sectional shape, a height, or a surface roughness, of the pattern formed on the substrate relative to a pattern of the mold is caused to fall within a tolerance by concentration of the condensable gas in the gas mixture supplied to the space with respect to each combination between a type of the imprint material and a type of a feature, including at least one of a dimension and a shape, of the pattern to be formed.

26. The method according to claim 25, wherein the supplying supplies, to the space, the condensable gas, and a penetrating gas that penetrates the mold.

27. An imprint apparatus for forming a pattern on a substrate by pressing a mold against an imprint material on the substrate, the apparatus comprising:
   a supply device configured to supply, to a space between the mold and the substrate, a gas mixture including a condensable gas that is liquefied by the pressing; and
   a controller configured to control concentration of the condensable gas in the space by the supply device based on a contraction ratio of the pattern, relative to a pattern of the mold, formed on the substrate with respect to a target line width of the pattern to be formed on the substrate, wherein the contraction ratio of the pattern formed on the substrate differs by the target line width of the pattern to be formed on the substrate even if the concentration of the condensable gas is the same.

28. A method of manufacturing an article, the method comprising:

forming a pattern on a substrate using an imprint apparatus defined in claim 27; and processing the substrate, on which the pattern has been formed, to manufacture the article.

29. An imprint apparatus for forming a pattern on a substrate by pressing a mold against an imprint material on the substrate, the apparatus comprising:

a supply device configured to supply, to a space between the mold and the substrate, a gas mixture including a condensable gas that is liquefied by the pressing; and a controller configured to control concentration of the condensable gas in the space by the supply device based on a contraction ratio of the pattern, relative to a pattern of the mold, formed on the substrate with respect to a combination between a type of the imprint material and a target line width of the pattern to be formed on the substrate, wherein the contraction ratio of the pattern formed on the substrate differs by the combination between the type of the imprint material and the target line width of the pattern to be formed on the substrate even if the concentration of the condensable gas is the same.

30. A method of manufacturing an article, the method comprising:

forming a pattern on a substrate using an imprint apparatus defined in claim 29; and processing the substrate, on which the pattern has been formed, to manufacture the article.

31. An imprint apparatus for forming a pattern on a substrate by pressing a mold against an imprint material on the substrate, the apparatus comprising:

a supply device configured to supply, to a space between the mold and the substrate, a gas mixture including a condensable gas that is liquefied by the pressing, wherein a contraction ratio of the pattern, relative to a pattern of the mold, formed on the substrate is caused to fall within a tolerance by concentration of the condensable gas in the space adjusted by the supply device with respect to a target line width of the pattern to be formed on the substrate, wherein the contraction ratio of the pattern formed on the substrate differs by the target line width of the pattern to be formed on the substrate even if the concentration of the condensable gas is the same.

32. A method of manufacturing an article, the method comprising:

forming a pattern on a substrate using an imprint apparatus defined in claim 31; and processing the substrate, on which the pattern has been formed, to manufacture the article.

33. An imprint apparatus for forming a pattern on a substrate by pressing a mold against an imprint material on the substrate, the apparatus comprising:

a supply device configured to supply, to a space between the mold and the substrate, a gas mixture including a condensable gas that is liquefied by the pressing, wherein a contraction ratio of the pattern, relative to a pattern of the mold, formed on the substrate is caused to fall within a tolerance by concentration of the condensable gas in the space adjusted by the supply device with respect to a combination between a type of the imprint material and a target line width of the pattern to be formed on the substrate, wherein the contraction ratio of the pattern formed on the substrate differs by the combination between the type of the imprint material and the target line width of the pattern to be formed on the substrate even if the concentration of the condensable gas is the same.

34. A method of manufacturing an article, the method comprising:

forming a pattern on a substrate using an imprint apparatus defined in claim 33; and processing the substrate, on which the pattern has been formed, to manufacture the article.

35. An imprint method of forming a pattern on a substrate by pressing a mold against an imprint material on the substrate, the method comprising:

pressing the mold against the imprint material with a gas mixture including a condensable gas, that is liquefied by the pressing, supplied to a space between the mold and the substrate, wherein concentration of the condensable gas in the space is controlled based on a contraction ratio of the pattern, relative to a pattern of the mold, formed on the substrate with respect to a target line width of the pattern to be formed on the substrate, wherein the contraction ratio of the pattern formed on the substrate differs by the target line width of the pattern to be formed on the substrate even if the concentration of the condensable gas is the same.

36. An imprint method of forming a pattern on a substrate by pressing a mold against an imprint material on the substrate, the method comprising:

pressing the mold against the imprint material with a gas mixture including a condensable gas, that is liquefied by the pressing, supplied to a space between the mold and the substrate, wherein concentration of the condensable gas in the space is controlled based on a contraction ratio of the pattern, relative to a pattern of the mold, formed on the substrate with respect to a combination between a type of the imprint material and a target line width of the pattern to be formed on the substrate, wherein the contraction ratio of the pattern formed on the substrate differs by the combination between the type of the imprint material and the target line width of the pattern to be formed on the substrate even if the concentration of the condensable gas is the same.

37. An imprint method of forming a pattern on a substrate by pressing a mold against an imprint material on the substrate, the method comprising:

pressing the mold against the imprint material with a gas mixture including a condensable gas, that is liquefied by the pressing, supplied to a space between the mold and the substrate, wherein a contraction ratio of the pattern, relative to a pattern of the mold, formed on the substrate is caused to fall within a tolerance by concentration of the condensable gas in the space adjusted with respect to a target line width of the pattern to be formed, wherein the contraction ratio of the pattern formed on the substrate differs by the target line width of the pattern to be formed on the substrate even if the concentration of the condensable gas is the same.

38. An imprint method of forming a pattern on a substrate by pressing a mold against an imprint material on the substrate, the method comprising:

pressing the mold against the imprint material with a gas mixture including a condensable gas, that is liquefied by the pressing, supplied to a space between the mold and the substrate, wherein a contraction ratio of the pattern, relative to a pattern of the mold, formed on the substrate relative to a pattern of the mold is caused to fall within a tolerance by concentration of the condensable gas in the space adjusted with respect to a target line width of the pattern to be formed, wherein the contraction ratio of the pattern formed on the substrate differs by the combination between the type of the imprint material and the target line width of the pattern to be formed on the substrate even if the concentration of the condensable gas is the same.

\* \* \* \* \*